United States Patent
Li et al.

(10) Patent No.: US 9,173,317 B2
(45) Date of Patent: Oct. 27, 2015

(54) USB FLASH DISK AND ASSEMBLY METHOD THEREOF

(75) Inventors: Zhixiong Li, Guangdong (CN); Weiwen Pang, Guangdong (CN); Ping Wang, Guangdong (CN); Riming Zhong, Guangdong (CN)

(73) Assignee: SHENZHEN NETCOM ELECTRONICS CO., LTD., Guangdong (CN)

( * ) Notice: Subject to any disclaimer, the term of this patent is extended or adjusted under 35 U.S.C. 154(b) by 211 days.

(21) Appl. No.: 13/982,695

(22) PCT Filed: Aug. 29, 2011

(86) PCT No.: PCT/CN2011/079048
§ 371 (c)(1),
(2), (4) Date: Jul. 30, 2013

(87) PCT Pub. No.: WO2012/162967
PCT Pub. Date: Dec. 6, 2012

(65) Prior Publication Data
US 2013/0308288 A1    Nov. 21, 2013

(30) Foreign Application Priority Data

Jun. 3, 2011 (CN) .......................... 2011 1 0149676
Jun. 3, 2011 (CN) ....................... 2011 2 0187223 U
Jul. 25, 2011 (CN) ....................... 2011 2 0263886 U (51) Int. Cl.
*H05K 1/14*         (2006.01)
*H05K 7/14*         (2006.01)
(Continued)

(52) U.S. Cl.
CPC ........ *H05K 7/1401* (2013.01); *G06K 19/07732* (2013.01); *H05K 13/00* (2013.01); *Y10T 29/49002* (2015.01)

(58) Field of Classification Search
USPC ............ 361/679.01, 679.02, 679.55, 679.56, 361/737; 439/607, 504, 939, 569, 566, 527, 439/544, 562, 607.01, 607.35, 607.38
See application file for complete search history.

(56) References Cited

U.S. PATENT DOCUMENTS 7,802,997 B2 *   9/2010   Kuo ............................. 439/76.1
8,116,086 B2 *   2/2012   Huang .......................... 361/752
(Continued)

FOREIGN PATENT DOCUMENTS

CN          2852611 Y      12/2006
CN         101727960 A      6/2010
(Continued)

*Primary Examiner* — Hung S Bui
(74) *Attorney, Agent, or Firm* — Birch, Stewart, Kolasch & Birch, LLP (57) ABSTRACT

A USB flash disk includes a metal head with a cavity, a support received in the cavity and a USB flash disk chip disposed on the support. The support includes an upper support and a lower support. One end of the upper support is connected to an end of the lower support. The upper support and the lower support form a receiving cavity therebetween to receive the USB flash disk chip. The upper support is provided with a latching structure with an opening on an outer surface thereof. The opening is defined at one end of the upper support connected to the lower support. The latching structure includes an inclined block located in a middle portion thereof and a latching groove defined on the latching structure away from the end of the upper support connecting to the lower support. An inner wall of the cavity is provided with a latching block latched in the latching groove. The USB flash disk chip includes an integrated circuit packaged inside configured for storing, the USB flash disk chip is provided with a first set of metal contacts on a surface thereof compliant with the USB interface protocol. The users can independently choose the characteristics of each component of the USB flash disk and then complete the USB flash disk assembly according to their own preferences.

18 Claims, 12 Drawing Sheets

(51) Int. Cl.
*G06K 19/077* (2006.01)
*H05K 13/00* (2006.01)

(56) References Cited

U.S. PATENT DOCUMENTS

| | | | |
|---|---|---|---|
| 8,760,876 B2* | 6/2014 | Huang | 361/737 |
| 8,811,006 B2* | 8/2014 | Huang | 361/679.31 |
| 2005/0094364 A1 | 5/2005 | Chang et al. | |
| 2009/0275224 A1* | 11/2009 | Ni et al. | 439/131 |
| 2010/0290181 A1* | 11/2010 | Huang | 361/679.32 |

FOREIGN PATENT DOCUMENTS

| | | |
|---|---|---|
| CN | 201655321 U | 11/2010 |
| CN | 201788694 U | 4/2011 |

* cited by examiner

USB FLASH DISK AND ASSEMBLY METHOD THEREOF

FIELD OF THE INVENTION

The present invention relates to the technical field of memory, and more particularly relates to a USB flash disk which can be assembled by the users and an assembly method of the USB flash disk.

BACKGROUND OF THE INVENTION

USB flash disk is a portable storage device, due to the feature of plug and play of the USB interface, the USB flash disk has become a necessity in people's daily life.

In the prior art, the final assembly of the USB flash disk is completed in the factory by a specific tool, so users can only choose the type of the USB flash disk that manufacturers assembled for sale, for example, the users can only choose the USB flash disk of a fixed capacity, color, etc., and they can not choose their favorite shell according to their preferences, or can not choose the capacity of the USB flash disk according to their own use, that is, the users can not make the final assembly of the USB flash disk.

SUMMARY OF THE INVENTION

It is an object of the present invention to provide a USB flash disk which can be assembled by users and an assembly method of the USB flash disk.

A USB flash disk includes a metal head with a cavity, a support received in the cavity and a USB flash disk chip disposed on the support; the support includes an upper support and a lower support; one end of the upper support is connected to an end of the lower support, and the upper support and the lower support form a receiving cavity therebetween to receive the USB flash disk chip; the upper support is provided with a latching structure with an opening on an outer surface thereof, the opening is defined at one end of the upper support connected to the lower support, the latching structure includes an inclined block located in a middle portion thereof and a latching groove defined on the latching structure away from the end of the upper support connecting to the lower support, an inner wall of the cavity is provided with a latching block latched in the latching groove, the USB flash disk chip comprises an integrated circuit packaged inside configured for storing, the USB flash disk chip is provided with a first set of metal contacts on a surface thereof compliant with the USB interface protocol.

In a preferred embodiment, the metal head is provided with a stop block at the rear end thereof abutting the support, the end of the upper support connecting the lower support abuts the stop block.

In a preferred embodiment, the lower support is provided with a stop bar at an end thereof away from the end of the lower support connecting to the upper support, the USB flash disk chip abuts the stop bar.

In a preferred embodiment, the end of the upper support connecting to the lower support defines a first groove on an upper surface thereof, the end of the upper support connecting to the lower support defines a second groove.

In a preferred embodiment, the chip of the USB flash disk is provided with a second set of metal contacts on the surface thereof configured for connecting external components to extend the function of the USB flash disk chip.

In a preferred embodiment, the second set of metal contacts are provided with indicator lamps.

In a preferred embodiment, the USB flash disk chip is shaped as a cuboid, the sizes of the cuboid are: 14.95 mm≤length≤15.05 mm, 10.95 mm≤width≤11.05 mm, 1.35 mm≤height≤1.45 mm.

In a preferred embodiment, the USB flash disk further includes a housing, the housing is fixed to the rear end of the metal head.

In a preferred embodiment, the upper support latches the lower support and abuts the USB flash disk chip, an end of the upper support away from the lower support forms a step protruding upwardly on a side thereof away from the lower support, the latching structure is disposed on the step.

In a preferred embodiment, the upper support and lower support form a notch therebetween communicating with the receiving cavity away from the end of the upper support body latching the lower support, the first set of metal contacts are received in the notch.

In a preferred embodiment, one end of the upper support or the lower support forms a latching block, the other end of the upper support or the lower support defines a latch groove, the latching block is latched in the latching groove such that the upper support is connected to the lower support.

In a preferred embodiment, the upper support forms the latching block at one end thereof, the lower support defines the latching groove at one end thereof.

In a preferred embodiment, the upper support defines a through hole extending through the upper support, the through hole is adjacent to the latching block.

In a preferred embodiment, the step of the upper support defines a groove at a side which is adjacent to the cavity of the metal head.

In a preferred embodiment, the support further includes a positioning structure located on the upper support and the lower support.

In a preferred embodiment, the positioning structure includes a positioning column located on one of the upper support and the lower support and a positioning hole defined on the other of the upper support and the lower support, the positioning column extends through the positioning hole.

In a preferred embodiment, the lower support is provided with a positioning bar, the lower support is provided with a stop bar at an end thereof away from the upper support, two ends of the USB flash disk chip abuts the positioning bar and the stop bar, respectively.

An assembly method of the USB flash disk is provided, the USB flash disk includes a metal head with a cavity, a support and a USB flash disk chip, the support includes an upper support and a lower support, one end of the upper support is connected to an end of the lower support, the upper support and the lower support form a receiving cavity therebetween, the upper support is provided with a latching structure with an opening on the outer surface thereof, the opening is defined at one end of the upper support connecting to the lower support, the latching structure includes an inclined block located in the middle of the latching structure and a latching groove defined on the latching structure away from the end of the upper support connecting to the lower support, a latching block is disposed on the inner wall of the cavity, wherein the method includes the following steps: receiving the USB flash disk chip in the receiving cavity of the support, inserting the support loaded with the USB flash disk chip in the cavity of the metal head from the front end of the metal head, thus the latching block is latched in the latching groove.

In a preferred embodiment, the USB flash disk further includes a housing, before the support loaded with the USB flash disk chip inserts in the cavity of the metal head, the housing is fixed to the rear end of the metal head.

For the aforementioned USB flash disk, the USB flash disk chip is received in the receiving cavity, the support extends through the cavity of the metal head, the latching block of the inner wall of the cavity slides along the inclined block from the opening of the latching structure, finally enter into the latching groove and latched in the groove, the support is fixed to the metal head, the USB flash disk does not need to complete the final assembly in the manufacturers, the users can complete the final assembly by themselves, the users can independently choose the characteristics of each component of the USB flash disk and then complete the USB flash disk assembly according to their own preferences.

DETAILED DESCRIPTION OF THE EMBODIMENTS

The invention will be described in detail with the following embodiments and drawings.

Referring to FIGS. 1 through 7, a USB flash disk 10 of the first embodiment includes a metal head 11, a support 13 received in the metal head 11, and a USB flash disk chip 12. The metal head 11 defines a cavity 111, and the cavity 111 extends through the two ends of the metal head 11, the support 13 is received in the metal head 11 by inserting.

In the illustrated embodiment, the support 13 defines a receiving cavity 132 to receive the USB flash disk chip 12, the USB flash disk chip 12 is received in the receiving cavity 132 of the support 13, the support 13 is received in the metal head 11.

Figure 1:
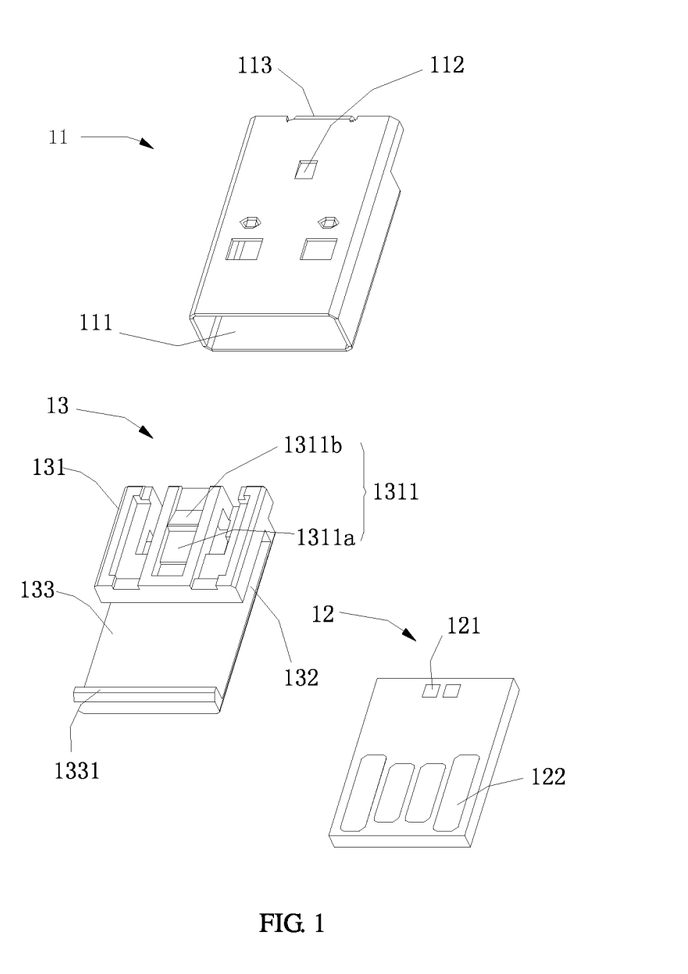
FIG. 1 is an exploded, isometric perspective view of a USB flash disk omitting a housing in accordance with a first embodiment.
Figure 5:
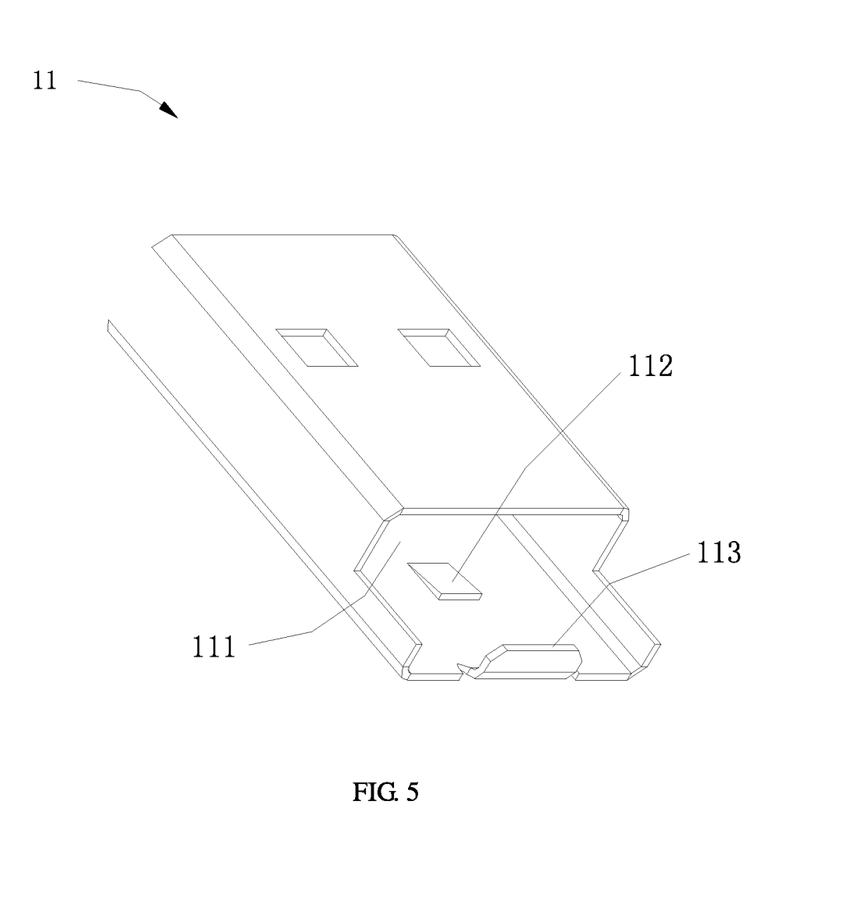
FIG. 5 is a isometric perspective view of the metal head in FIG. 1.

When the support 13 is inserted in the metal head 11 and reaches an appropriate position, an upper end of the support 13 latches the inner wall of the cavity 111 of the metal head 11, such that a securely connection between the support 13 and the metal head 11 is achieved.

The illustrated structures are described as follows: the support 13 includes an upper support 131 and a lower support 133, one end of the upper support 131 is connected to an end of the lower support 133, the other end of the upper support 131 is unconnected, the upper support 131 and the lower support 133 form a receiving cavity 132 therebetween for receiving the USB flash disk chip 12. In addition, the upper support 131 is provided with a latching structure 1311 with an opening on the outer surface thereof, the latching structure 1311 includes an inclined block 1311b located in the middle of the latching structure 1311 and a latching groove 1311a defined on the latching structure 1311 away from the end of the upper support 131 connecting to the lower support 133, correspondingly, the inner wall of the cavity 111 of the metal head 11 is provided with a latching block 112 which can be latched in the latching groove 1311a. During the assembling of the support 13 and the metal head 11, the latching block 112 is latched in the latching groove 1311a.

It is to be understood that, the inner wall of the cavity 111 of the metal head 11 may be provided with a latching structure 1311, the upper support 131 is provided with a latching block 112 which can be latched in the latching groove 1311a of the latching structure 1311 on the outer surface thereof. It is to be understood that, the latching structure 1311 or the latching block 112 can also be disposed on the lower support 113, correspondingly, the inner wall of the cavity 111 is provided with the latching block 112 or the latching structure 1311 which can be matched with the latching structure 1311 or the latching block 112, specific configurations are dependent upon the particular needs and desires of the user.

In the illustrated embodiment, during the assembly of the support 13 and the metal head 11, the latching block 112 disposed on the inner wall of the cavity 111 can slide into the latching groove 1311a through the inclined block 1311b and abut the inclined block 1311b, thus the latching block 112 is latched in the latching groove 1311a.

The upper support 13 is received in the cavity 111 of the metal head 11 by inserting, it inserts from the front end of the metal head 11 and reaches an appropriate position, and it is disposed in the metal head 11. In order to positioning the support 13 in the metal head 11, and prevent the metal head 11 from falling off from the rear end of the metal head 11, the metal head 11 is provided with a stop block 113 at the rear end thereof, the stop block 113 is capable of abutting the support 13. When the support 13 reaches an appropriate position during the inserting of the support 13 into the metal head 11, the support 13 will abut the stop block 113, thus the positioning of the support 13 received in the metal head 11 can be achieved.

Figure 2:
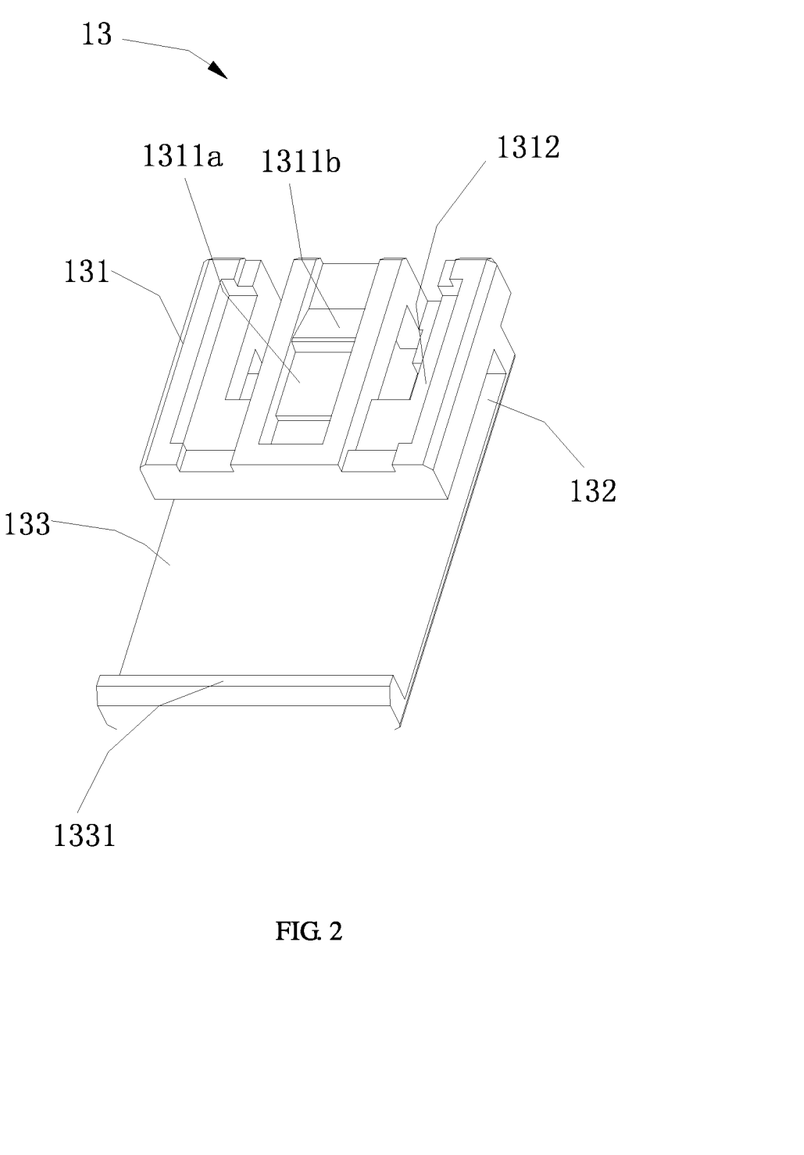
FIG. 2 is a isometric perspective view of the support in FIG. 1.
Figure 3:
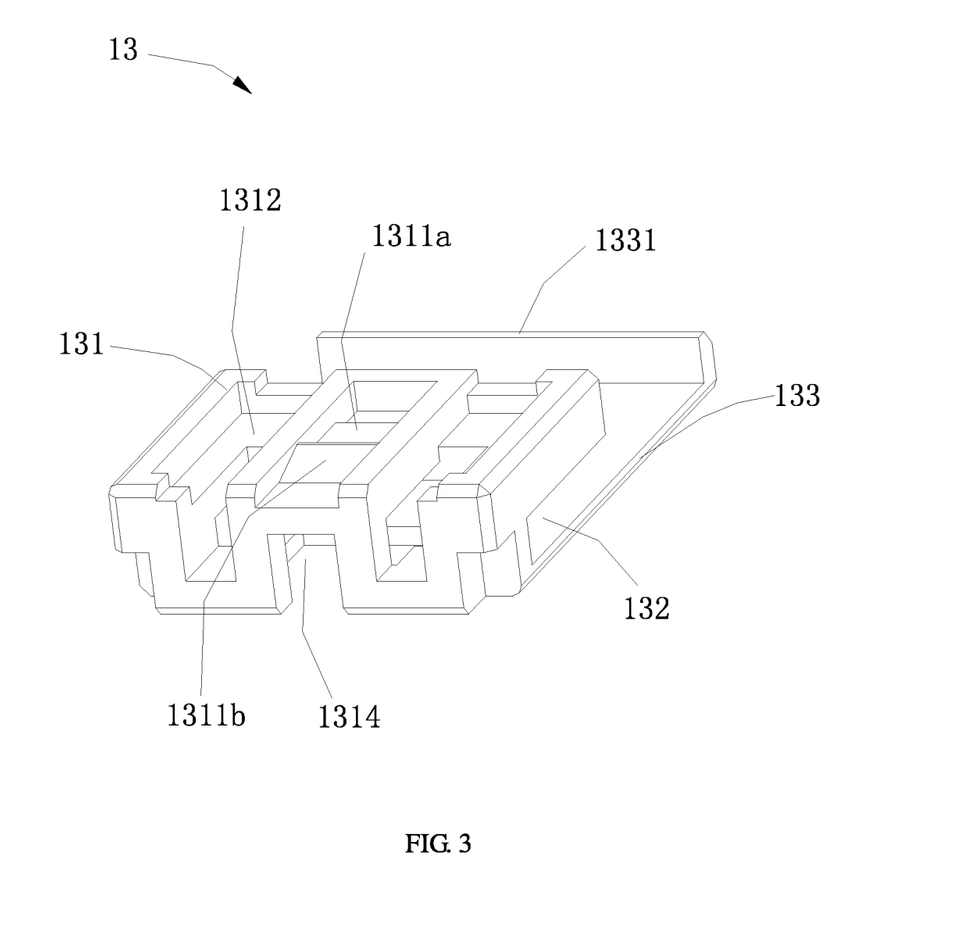
FIG. 3 is a isometric perspective view of the support in FIG. 2 viewed from another aspect.

In one embodiment, an integrated circuit configured for storing is packaged inside the USB flash disk chip 12, a first set of metal contacts 122 compliant with the USB interface protocol are disposed on the surface of the USB flash disk chip 12, so the USB flash disk chip 12 can be used for data storing and can transfer data with host which has external USB interface, the chip can be received in the support 13. When the USB flash disk chip 12 is received in the receiving cavity 132 of the support 13, in order to prevent the USB flash disk chip 12 from falling off from the receiving cavity 132 of the support 13, the lower support 133 is provided with a stop bar 1331 at the other end thereof, when the USB flash disk chip 12 is received in the receiving cavity 132 of the support 13, the stop bar 1331 is capable of abutting the USB flash disk chip 12, thus the USB flash disk chip 12 can not fall off from the receiving cavity 132 of the support 13.

For the assembled USB flash disk, the support 13 latches the metal head 11, and the lower support 133 is provided with the stop block 113 at the other end thereof which can be used for the positioning of the support 13, the block prevents the support 13 from falling off from the rear end of the metal head 11, the lower support 133 is provided with the stop bar 1331 which can abut the USB flash disk chip 12, thus the USB flash disk chip 12 received in the receiving cavity 132 is positioned, thus, the metal head 11, the support 13 and the USB flash disk chip 12 can be securely connected together with accurate positioning.

Figure 4:
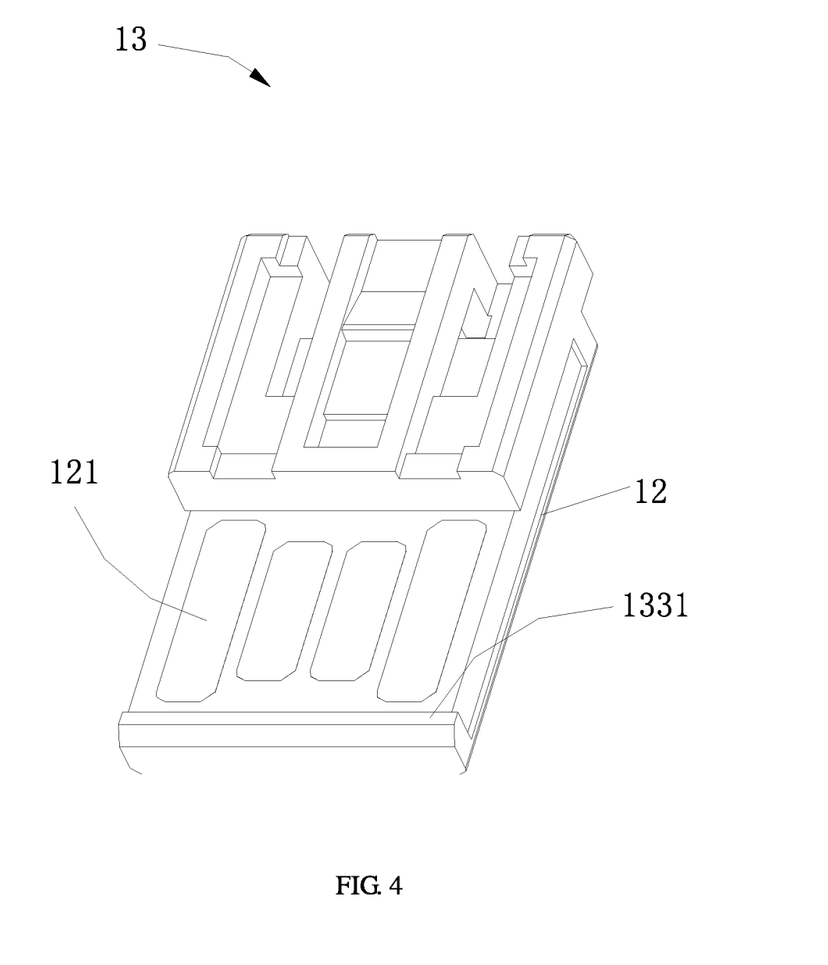
FIG. 4 is an assembled perspective view of the USB flash disk chip and the support in FIG. 1.

The USB flash disk chip 12 is provided with a first set of metal contacts 122 on the surface thereof which can be used for electrical connection to the external equipment. In order to make the first set of metal contacts 122 of the USB flash disk chip 12 received in the cavity of the receiving cavity 132 of the support 13 electrically connect to an external equipment, the upper support 131 is shorter than that of the lower support 133, thus, the receiving cavity 132 formed by the upper support 131 and the lower support 133 is non-closed, when the USB flash disk chip 12 is received in the receiving cavity 132 of the support 13, the first set of metal contacts 122 can be exposed from the receiving cavity 132.

The USB flash disk chip 12 are provided with a second set of metal contacts 121 on the surface thereof, the second set of metal contacts 121 are capable of connecting to other functional components for extending the function of the USB flash disk, such as LED indicators etc.

In the illustrated embodiment, the upper support 131 and the lower support 133 are integrally molded, it is to be understood that, the upper support 131 and the lower support 133 can be produced separately and then fixed as a whole by subsequent process.

The upper support 131 defines a first groove 1312 on an upper surface thereof connecting to the lower support 133, the first groove 1312 can ensure a more uniform thickness of the upper support 131, which increases the deformation capacity of the upper support 131 and the lower support 133.

The upper support 131 defines a second groove 1314 on a lower surface thereof connecting to the lower support 133, the configuration of the second groove 1314 ensures a more uniform thickness of the upper support 131, which increases the deformation capacity of the upper support 131 with respect to the lower support 133.

When the USB flash disk chip 12 is equipped with an LED indicator, the first groove 1312 and the second groove 1314 can be used for transmitting light.

Figure 6:
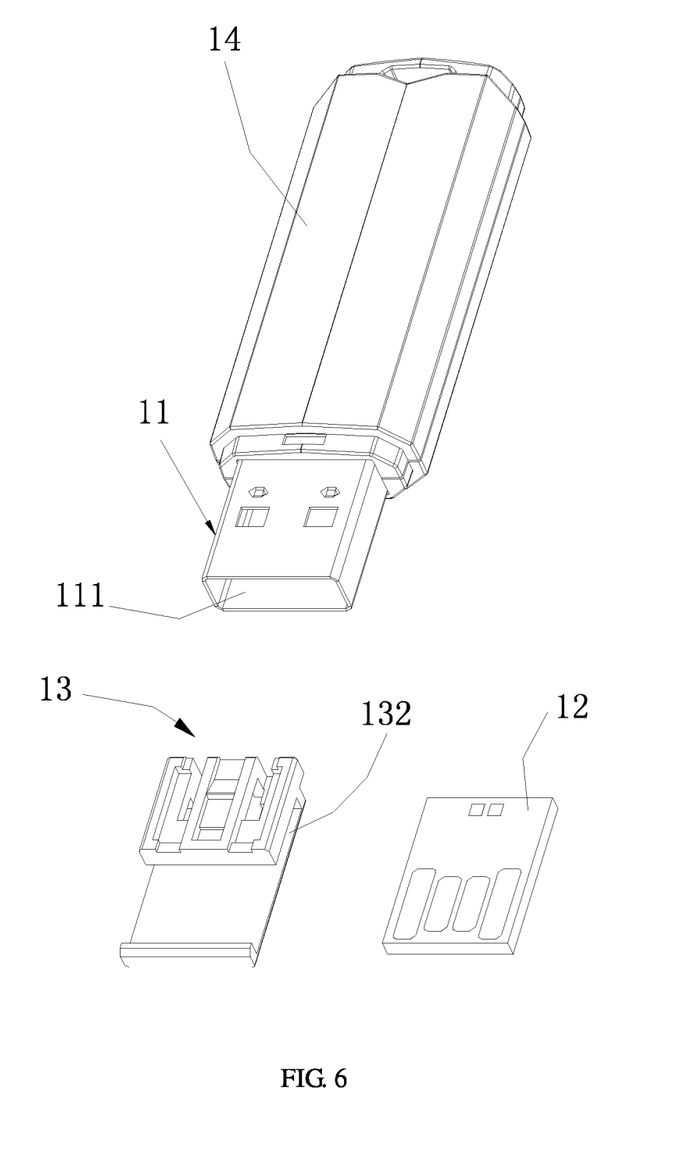
FIG. 6 is an exploded, isometric perspective view of the USB flash disk in accordance with the first embodiment.
Figure 7:
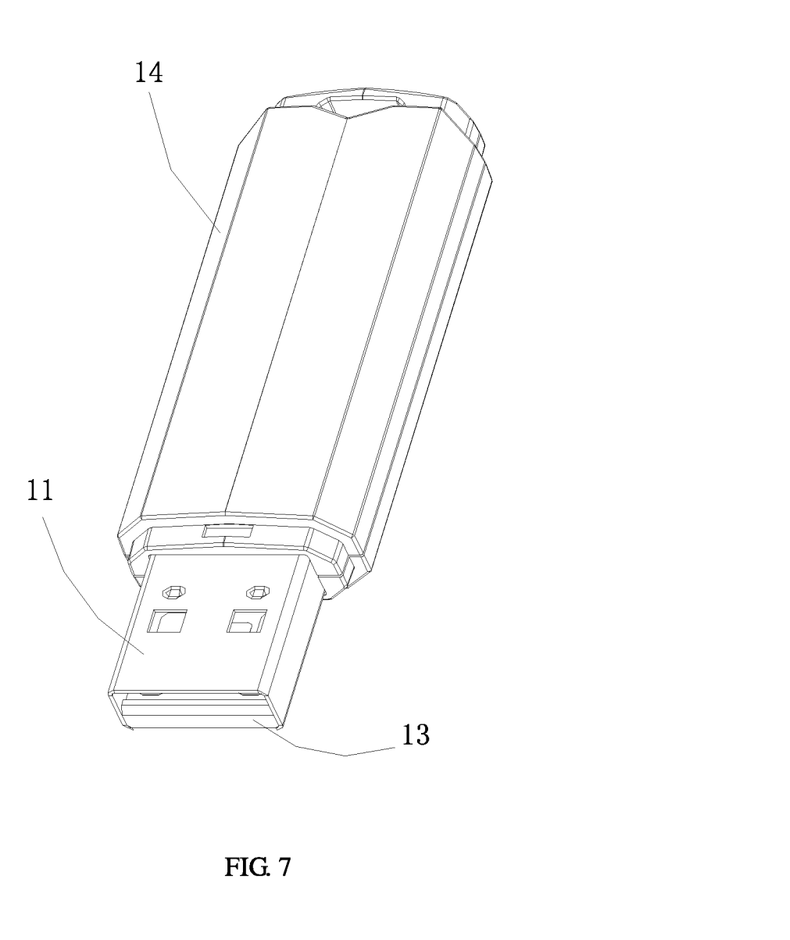
FIG. 7 is an assembled perspective view of the USB flash disk in FIG. 6.

In order to improve the decorative appearance of the USB flash disk, the USB flash disk is provided with a housing 14, one end of the housing 14 is fixed to the rear end of the metal head 11, thus, the metal head 11 and the housing 14 act as a whole, the support 13 can be directly inserted in the metal head 11.

The USB flash disk chip 12 can take many forms, in the illustrated embodiment, the USB flash disk 12 is shaped as a cuboid, the sizes of the cuboid are: 14.95 mm≤length≤15.05 mm, 10.95 mm≤width≤11.05 mm, 1.35 mm≤height≤1.45 mm, preferably, the height is 15 mm, the width is 11 mm, the height is 1.4 mm. The USB flash disk chip 12 can be received in the support 13, it is to be understood that, the size of the receiving cavity can be designed according to the sizes of the cuboid of the USB flash disk chip 12, thus the receiving cavity matches the USB flash disk chip 12, for example, the USB flash disk chip with dimensions of 11 mm×12 mm×1.4 mm can be received in the support of the USB flash disk.

The aforementioned USB flash disk is compliant with the USB male connector standard of the USB flash disk, and can be connected to the host which has a standard USB female connector for data communication.

The illustrated invention also provides an assembly method of the USB flash disk, which includes:

First, the USB flash disk chip 12 is received in the receiving cavity 132 of the support 12, then the support 13 equipped with the USB flash disk chip 12 is inserted in the cavity 111 of the metal head 11 from the front end of the metal head 11, the latching block 112 of the metal head 11 is latched in the latching groove 1311*a* of the support 13, thus the assembly of the USB flash disk is completed, the metal head 11, the support 13 and the USB flash disk chip 12 can be securely connected together, the assembly method can achieve rapid assembly of the USB flash disk, no specific assembly tools are needed, users can directly carry out the assembly operation.

In the assembly method described above, before assembly, the metal head 11 is fixed to the housing 14, the metal head 11 is fixed to an end of the housing 14, the support 13 inserts from an exposed end of the metal head 11.

Specifically, the USB flash disk chip 12 is received in the receiving cavity 132 of the support 13 from one side of the support 13, thus the assembly of the USB flash disk chip 12 and the support 13 is completed.

Referring also to FIG. 8 through FIG. 12, a USB flash disk 60 according to a second embodiment includes a metal head 61, a support located in the metal head 61, a USB flash disk chip 62 received in the support, the metal head 61 defines a cavity 611, and the cavity 611 extends through two ends of the metal head 61, the support is inserted in the metal head 61.

Figure 8:
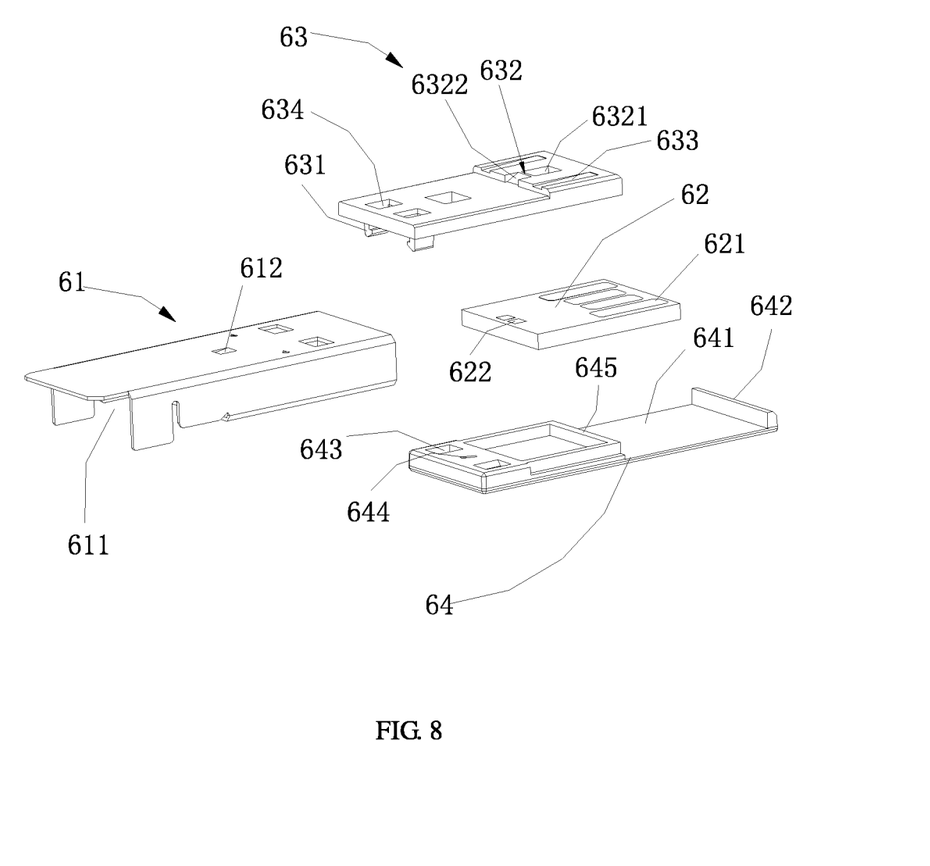
FIG. 8 is an exploded, isometric perspective view of the USB flash disk omitting a housing in accordance with the second embodiment.

In the illustrated embodiment, the support includes the upper support 63 and the lower support 64, the upper support 63 latches the lower support 64, the lower support 64 defines a receiving cavity 641 for receiving the USB flash disk chip 62. The USB flash disk chip 62 is received in the receiving cavity 641 of the lower support 64, the upper support 63 latches the lower support 64 again, and abuts the USB flash disk chip 62, finally, a whole body formed the upper support 63, the USB flash disk chip 62 and the lower support 64 is inserted in the cavity 611 of the metal head 61.

Figure 10:
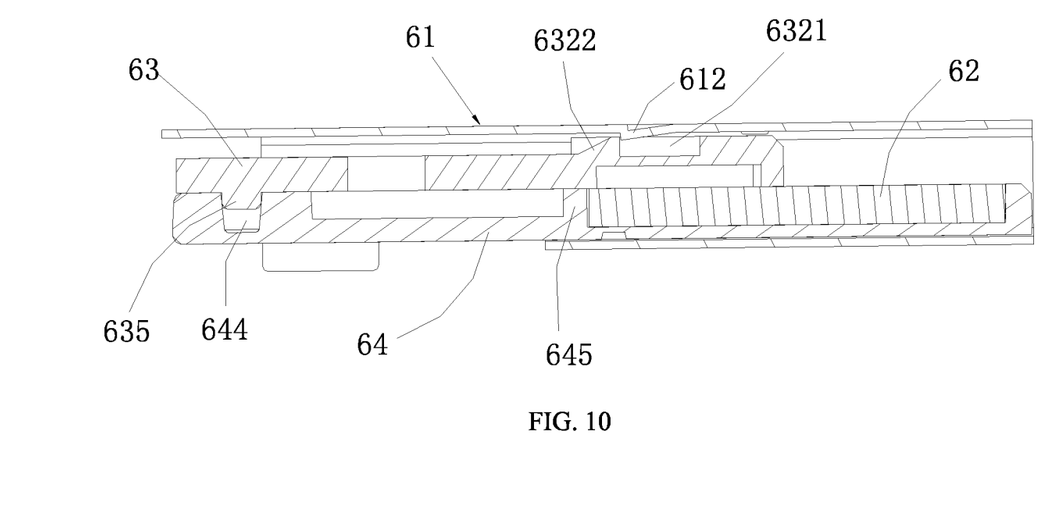
FIG. 10 is the cross section view taken along the X-X line in FIG. 9.

The lower surface of the rear end of the upper support 63 latches the rear end of the lower support 64, an end of the upper support 63 away from the lower support 64 forms a step protruding upwardly on a side thereof away from the lower support 64, i.e. protruding upwardly with respect to the upper surface of the rear end of the upper support 63 and the front end of the upper support 63 to form the step. When the whole body formed by the lower support 64, the USB flash disk chip 62 and the upper support 63 is inserted in the metal head 61 and reaches an appropriate position, the front end of the upper support 63 latches the inner wall of the cavity 611 of the metal head 61, thus the whole body and the metal head 61 can be securely connected.

The specific structures are: the upper support 63 is provided with a latching structure 632 with an opening on the step of the upper surface thereof, the latching structure 632 is capable of latching the inner wall of the cavity 611 of the metal head 61, the latching structure 632 includes an inclined block 6322 and a latching groove 6321 positioned on the front end of the inclined block 6322, correspondingly, the cavity 611 of the metal head 61 is provided with a latching block 612 which is capable of latching in the latching groove 6321 at the inner wall thereof, when the whole body inserts in the metal head 61, the latching structure 632 of the upper support 63 latches the inner wall of the cavity 611 of the metal head.

It is to be understood that, the inner wall of the cavity 611 of the metal head 61 is provided with the latching structure 632, the upper support 63 is provided with a latching block 612 which is capable of latching in the latching groove 6321 of the latching structure 632 on the outer surface of the front end thereof, specific configurations are dependent upon the particular needs and desires of the user.

In the illustrated embodiment, when the whole body formed by the upper support 63, the USB flash disk chip 62 and the lower support 64 is engaged with the metal head 61, the specific process is described as follows: as the whole body is inserted, the latching block 612 disposed on the inner wall of the cavity 611 of the metal head 61 abuts the inclined block 6322, and slides along the inclined block 6322, latches in the latching groove 6321 of the front end of the inclined block 6322, abuts the inclined block 6322, thereby completing the process of the engagement.

In the illustrated embodiment, an integrated circuit configured for storing is packaged inside the USB flash disk chip 62, the USB flash disk chip 62 is provided with a first set of metal contacts 621 compliant with the USB interface protocol on the surface thereof, thus the USB flash disk chip 62 can be used for data storing and communicating with the host with external interface.

Figure 9:
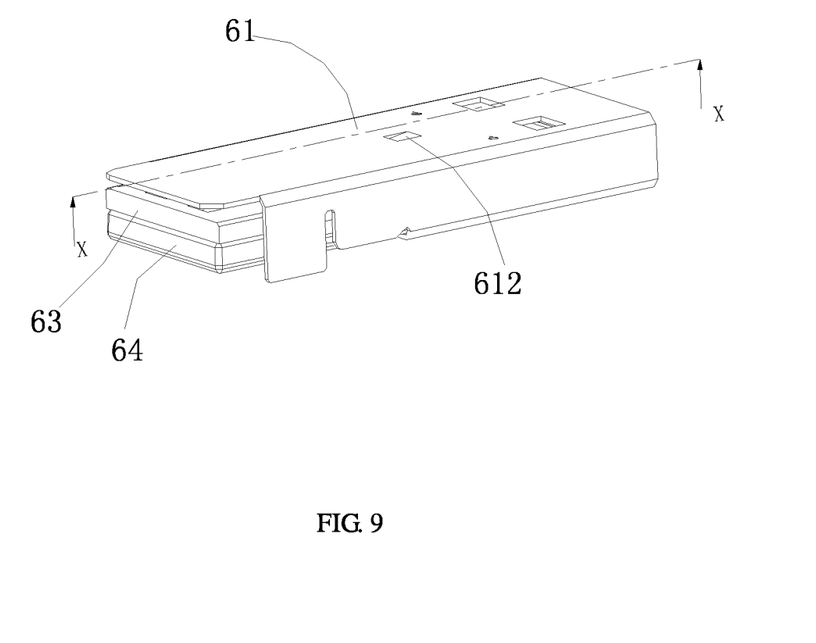
FIG. 9 is an assembled perspective view of the USB flash disk in FIG. 8.

In the structure of the USB flash disk described above, the whole body formed by the upper support 63, the USB flash disk chip 62, and the lower support 64 is received in the cavity 611 of the metal head 61 by inserting, the whole body is inserted from the rear end of the metal head 61, and reaches an appropriate position, the upper support 63 latches the metal head 61, thus the whole body is located in the metal head 61, the above assembly process is simple, the USB flash disk can be assembled without the need of special tools, the users can choose the USB flash disk components according to their need and preferences and assemble by themselves.

After the USB flash disk chip 62 is received in the receiving cavity 641 of the lower support 64, the upper support 63 latches the lower support 64, in order to make sure the first set of metal contacts 621 of the USB flash disk chip 62 are not covered by the upper support 63 and the first set of metal contacts 621 can communicate with the external equipment, the upper support 63 is shorter than the lower support 64, the upper support 63 and the lower support 64 form an opening therebetween, the opening communicates with the receiving cavity 641 of the lower support 64, thus the first set of metal contacts 621 of the USB flash disk chip 62 received in the receiving cavity 641 can be exposed from the opening.

Specifically, the rear end of the upper support 63 latches the rear end of the lower support 64, the rear end of the upper support 63 is provided with a latching block 631 on the lower surface thereof, correspondingly, the rear end of the lower support 64 defines a latching groove 643 which is capable of latching the latching block 631 on the surface thereof, when the latching block 631 is latched in the latching groove 643, the upper support 63 latches the lower support 64, after the upper support 63 latches the lower support 64, the front end of the upper support 63 and the front end of the lower support 64 form the opening, the first set of metal contacts 621 of the USB flash disk chip 62 located in the lower support 64 are exposed from the opening.

It is to be understood that, the rear end of the upper support 63 defines a latching groove 643 on the lower surface thereof, the lower support 64 is provided with the latching block 631 which is capable of latching in the latching groove 643.

In order to facilitate the processing of the latching block 631 located on the surface of the rear end of the upper support 63, the upper support 63 defines a through hole 634 extending through the upper support 63 at the rear end thereof, which facilitates the processing of the latching block 631 of the upper support 63 in the manufacturing process of the upper support 63.

In the illustrated embodiment, during the process of the inserting of the whole body formed by the upper support 63, the USB flash disk chip 62 and the lower support 64, in order to facilitate the inserting of the whole body, the front end of the upper support 63 defines a latching groove 633 on the upper surface thereof, due to the latching groove 633, the contact between the upper support 63 and the inner wall of the cavity 611 of the metal head 61 can be reduced, the friction is reduced which facilitates the assembly of the whole body and the metal head 61.

A positioning structure is positioned between the upper support 63 and the lower support 64, the positioning structure can prevent the inaccurate positioning when the upper support 63 latches the lower support 64, thus reducing the difficult of the assembly of the upper support 63 and the lower support 64.

Specifically, the rear end of the upper support 63 is provided with a positioning column 635 on the lower surface thereof, the lower support 64 defines a positioning hole 644 which is capable of latching the positioning column 635, after the upper support 63 latches the lower support 64, the positioning column 635 latches the positioning hole 644, when the upper support 63 do not latch the lower support 64, the positioning column 635 will not latch the positioning hole 644.

It is to be understood that, the rear end of the upper support 63 defines a positioning hole 644 on the lower surface thereof, correspondingly, the lower support 64 is provided with a positioning column 635 which is capable of latching the positioning hole 644.

A positioning bar 645 is received in the receiving cavity 641 of the lower support 64, the positioning bar 645 is located on the middle of the lower support 64, the lower support 64 is provided with a stop bar 642 on an end of the upper support 63 latching the lower support 64, when the USB flash disk chip 62 is received in the receiving cavity 641, one end of the chip abuts the positioning bar 645, the other end abuts the stop bar 642, thus the position of the USB flash disk chip 62 received in the receiving cavity 641 is restricted, it is to be understood that, the users can change the position of the positioning bar 645 and adjust the length of the positioning bar 645 and the front end of the lower support 64 according to the actual size of the USB flash disk chip 62, thus the USB flash disk chip 62 of different length can be adapted.

During the process of the whole body formed by the upper support 63, the USB flash disk chip 62 and the lower support 64 are inserted in the metal head 61, in order to facilitate the positioning of the metal head 61 and prevent the whole body from falling off from the front end of the metal head 61, the metal head 61 is provided with a stop block at the front end thereof, the stop block is capable of abutting the front end of the lower support 64, the stop block can prevent the whole body from falling off from the front end of the metal head 61.

The USB flash disk chip 62 is provided with a second set of metal contacts 622 on the surface thereof, the second set of metal contacts 622 are used to connect other functional elements to extend the function of the USB flash disk, such as LED indicators etc.

Figure 11:
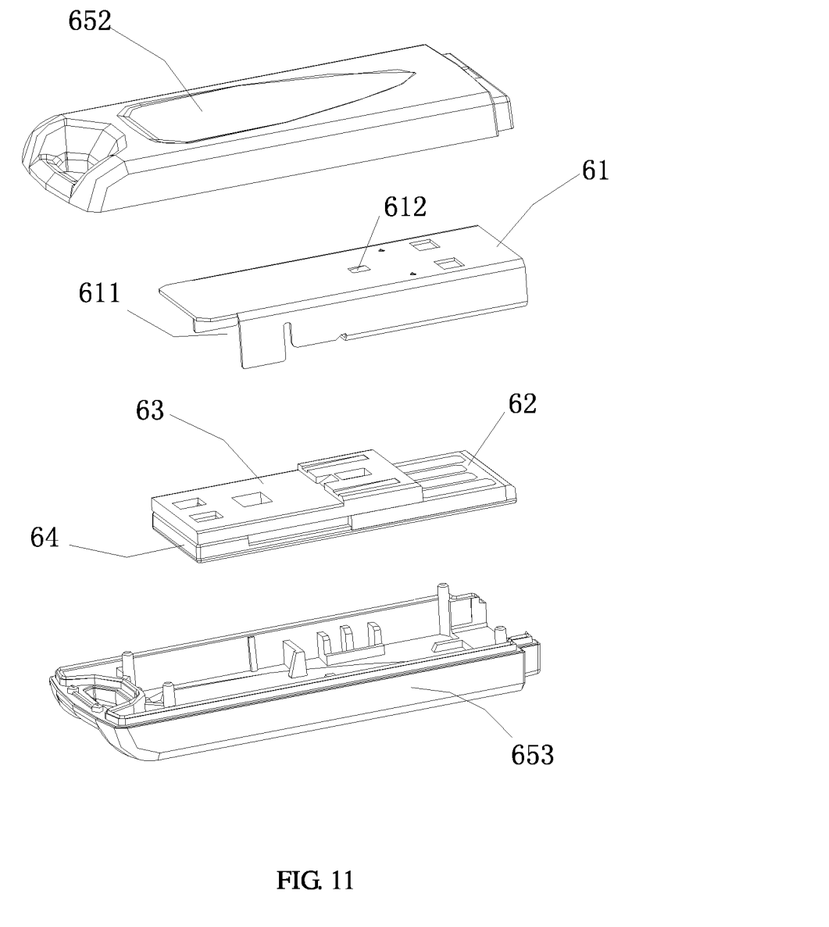
FIG. 11 is an exploded, isometric perspective view of the USB flash disk in accordance with the second embodiment.
Figure 12:
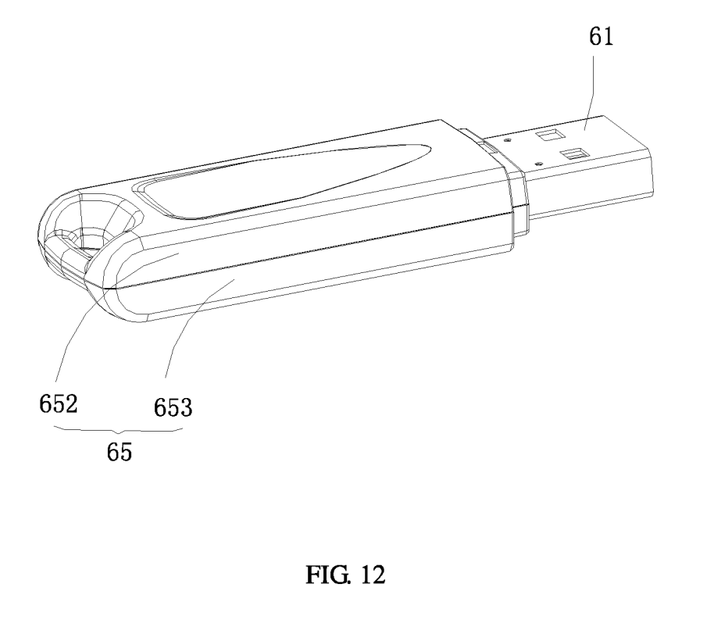
FIG. 12 is an assembled perspective view of the USB flash disk in FIG. 11.

In order to improve the appearance of the USB flash disk, the USB flash disk is further provided with a housing 65, one end of the housing 65 is fixed to the rear end of the metal head 61, thus the metal head 61 and the housing 65 act as a whole, the whole body formed by the upper support 63, the USB flash disk chip 62 and the lower support 64 inserts in the metal head 61.

It is to be understood that, in order to facilitate the assembly, the housing 65 includes a upper housing 652 and a lower housing 653 which cooperates with the upper housing 652, first, the metal head 61 is located on the lower housing 653, then the upper housing 652 cooperates with the lower housing 653, thus the assembly of the upper housing 652 and the lower housing 653 is completed.

The USB flash disk chip 62 can have many different forms, in the illustrated embodiment, the USB flash disk chip 62 is shaped as a cuboid, the sizes of the cuboid are: 14.95 mm≤length≤15.05 mm, 10.95 mm≤width≤11.05 mm, 1.35 mm≤height≤1.45 mm, preferably, the sizes of the cuboid are: the length is 15 mm, the width is 11 mm, the height is 1.4 mm, the USB flash disk chip 62 is capable of being located in the lower support 64, the size of the receiving cavity 641 of the lower support 64 can be designed according to the sizes of the cuboid of the USB flash disk chip 62, thus the USB flash disk chip 62 and the receiving cavity 641 can be matched, the USB flash disk chip 62 with the sizes of the cuboid of 11 mm×12 mm×1.4 mm can be located in the support of the USB flash disk.

The USB flash disk is compliant with the USB interface standard, which facilitate the communication with the host with standard USB female connector.

The assembly of the USB flash disk of the illustrated embodiment is shown as follows:

First, the USB flash disk chip 62 is received in the receiving cavity 641 of the lower support 64, then the upper support 63 latches the lower support 64, and the upper support 63 resists the USB flash disk chip 62 of the lower support 64, the whole body formed by the upper support 63, the USB flash disk chip 62 and the lower support 64 inserts in the cavity 611 of the metal head 61 from the rear end of the metal head 61, thus the upper support 63 latches the metal head 61 and the assembly of the USB flash disk is finished.

In the aforementioned assembly method, before the assembly, the metal head 61 is fixed to the housing 65, the metal head 61 is fixed to one end of the housing 65, the whole body formed by the upper support 63, the USB flash disk chip 62 and the lower support 64 inserts directly from the exposed end of the metal head 61.

Although the invention has been described in language specific to structural features and/or methodological acts, it is to be understood that the invention defined in the appended claims is not necessarily limited to the specific features or acts described. Rather, the specific features and acts are disclosed as sample forms of implementing the claimed invention.

What is claimed is:

1. A USB flash disk, comprising a metal head with a cavity, a support received in the cavity and a USB flash disk chip disposed on the support; the support includes an upper support and a lower support; one end of the upper support is connected to an end of the lower support, and defines a first groove on an upper surface thereof, the end of the upper support connecting to the lower support defining a second groove and the upper support and the lower support form a receiving cavity therebetween to receive the USB flash disk chip; the upper support is provided with a latching structure with an opening on an outer surface thereof, the opening is defined at one end of the upper support connecting to the lower support, the latching structure comprises an inclined block located in a middle portion thereof and a latching groove defined on the latching structure away from the end of the upper support connecting to the lower support, an inner wall of the cavity is provided with a latching block latched in the latching groove, the USB flash disk chip comprises an integrated circuit packaged inside configured for storing, and the USB flash disk chip is provided with a first set of metal contacts on a surface thereof compliant with the USB interface protocol and a second set of metal contacts disposed on the surface of the USB flash disk chip configured for connecting external components to extend the function of the USB flash disk chip wherein the upper support latches the lower support and abuts the USB flash disk chip, an end of the upper support away from the lower support forming a step protruding upwardly on a side thereof away from the lower support, the latching structure being disposed on the step.

2. The USB flash disk according to claim 1, wherein the metal head is provided with a stop block at the rear end thereof abutting the support, the end of the upper support connecting the lower support abuts the stop block.

3. The USB flash disk according to claim 2, wherein the lower support is provided with a stop bar at an end thereof away from the end of the lower support connecting to the upper support, the USB flash disk chip abuts the stop bar.

4. The USB flash disk according to claim 1, wherein the USB flash disk chip is shaped as a cuboid, the sizes of the cuboid are: 14.95 mm≤length≤15.05 mm, 10.95 mm≤width≤11.05 mm, 1.35 mm≤height≤1.45 mm.

5. The USB flash disk according to claim 1, further comprising a housing, the housing is fixed to the rear end of the metal head.

6. An assembly method of the USB flash disk, the USB flash disk comprises a metal head with a cavity, a support and a USB flash disk chip, the support comprises an upper support and a lower support, one end of the upper support is connected to an end of the lower support, the upper support and the lower support form a receiving cavity therebetween, the upper support is provided with a latching structure with an opening on the outer surface thereof, the opening is defined at one end of the upper support connecting to the lower support, the latching structure comprises an inclined block located in the middle of the latching structure and a latching groove defined on the latching structure away from the end of the upper support connecting to the lower support, a latching block is disposed on the inner wall of the cavity, wherein the method comprises the following steps: receiving the USB flash disk chip in the receiving cavity of the support, inserting the support loaded with the USB flash disk chip in the cavity of the metal head from the front end of the metal head, such that the latching block is latched in the latching groove.

7. The method according to claim 6, wherein the USB flash disk further comprises a housing, before the support loaded with the USB flash disk chip inserts in the cavity of the metal head, the housing is fixed to the rear end of the metal head.

8. A USB flash disk, comprising a metal head with a cavity, a support received in the cavity and a USB flash disk chip disposed on the support; the support includes an upper support and a lower support; one end of the upper support is connected to an end of the lower support, and the upper support and the lower support form a receiving cavity therebetween to receive the USB flash disk chip; the upper support is provided with a latching structure with an opening on an outer surface thereof, the opening is defined at one end of the upper support connected to the lower support, the latching structure comprises an inclined block located in a middle portion thereof and a latching groove defined on the latching structure away from the end of the upper support connecting to the lower support, an inner wall of the cavity is provided with a latching block latched in the latching groove, the USB flash disk chip comprises an integrated circuit packaged inside configured for storing, the USB flash disk chip is provided with a first set of metal contacts on a surface thereof compliant with the USB interface protocol and a second set of metal contacts disposed on the surface of the USB flash disk chip configured for connecting external components to extend the function of the USB flash disk chip.

9. The USB flash disk according to claim 8, wherein the second set of metal contacts are provided with indicator lamps.

10. A USB flash disk, comprising a metal head with a cavity, a support received in the cavity and a USB flash disk chip disposed on the support; the support includes an upper support and a lower support; one end of the upper support is connected to an end of the lower support, and the upper support and the lower support form a receiving cavity therebetween to receive the USB flash disk chip; the upper support is provided with a latching structure with an opening on an outer surface thereof, the opening is defined at one end of the upper support connected to the lower support, the latching structure comprises an inclined block located in a middle portion thereof and a latching groove defined on the latching structure away from the end of the upper support connecting to the lower support, an inner wall of the cavity is provided with a latching block latched in the latching groove, the USB flash disk chip comprises an integrated circuit packaged inside configured for storing, and the USB flash disk chip is provided with a first set of metal contacts on a surface thereof compliant with the USB interface protocol wherein the upper support latches the lower support and abuts the USB flash disk chip, an end of the upper support away from the lower support forming a step protruding upwardly on a side thereof away from the lower support, the latching structure being disposed on the step.

11. The USB flash disk according to claim 10, wherein the upper support and lower support form a notch therebetween communicating with the receiving cavity away from the end of the upper support body latching the lower support, the first set of metal contacts are received in the notch.

12. The USB flash disk according to claim 11, wherein one end of the upper support or the lower support forms a latching block, the other end of the upper support or the lower support defines a latch groove, the latching block is latched in the latching groove such that the upper support is connected to the lower support.

13. The USB flash disk according to claim 12, wherein the upper support forms the latching block at one end thereof, the lower support defines the latching groove at one end thereof.

14. The USB flash disk according to claim 13, wherein the upper support defines a through hole extending through the upper support, the through hole is adjacent to the latching block.

15. The USB flash disk according to claim 10, wherein the step of the upper support defines a groove at a side which is adjacent to the cavity of the metal head.

16. The USB flash disk according to claim 10, wherein the support further comprises a positioning structure located on the upper support and the lower support.

17. The USB flash disk according to claim 16, wherein the positioning structure comprises a positioning column located on one of the upper support and the lower support and a positioning hole defined on the other of the upper support and the lower support, the positioning column extends through the positioning hole.

18. The USB flash disk according to claim 10, wherein the lower support is provided with a positioning bar, the lower support is provided with a stop bar at an end thereof away from the upper support, two ends of the USB flash disk chip abuts the positioning bar and the stop bar, respectively.

* * * * *